United States Patent
Lambeta et al.

(10) Patent No.: US 11,313,898 B1
(45) Date of Patent: Apr. 26, 2022

(54) QUAD SMALL FORM-FACTOR PLUGGABLE THERMAL TEST VEHICLE

(71) Applicant: Meta Platforms, Inc., Menlo Park, CA (US)

(72) Inventors: Michael Maroye Lambeta, Milpitas, CA (US); David Edwin Stroud, Soquel, CA (US); Hussameddine Kabbani, San Jose, CA (US); Matthew Ross Hattori, Redwood City, CA (US); Benjamin Maloon, Los Altos, CA (US); Jones Udo-Akang, Hayward, CA (US); Vijay Mohan, San Jose, CA (US); Ahmad Byagowi, Milpitas, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 92 days.

(21) Appl. No.: 16/726,015

(22) Filed: Dec. 23, 2019

(51) Int. Cl.
*G01R 31/28* (2006.01)
*G01R 1/073* (2006.01)

(52) U.S. Cl.
CPC ..... *G01R 31/2875* (2013.01); *G01R 1/07342* (2013.01); *G01R 31/2891* (2013.01)

(58) Field of Classification Search
CPC ............... G01R 1/067; G01R 1/06716; G01R 1/06722; G01R 1/07307; G01R 1/07314
See application file for complete search history.

(56) References Cited

U.S. PATENT DOCUMENTS

| | | | |
|---|---|---|---|
| 2002/0109518 A1* | 8/2002 | Saito ................ | G01R 31/2868 324/750.09 |
| 2008/0130705 A1 | 6/2008 | Chen et al. | |
| 2008/0165824 A1 | 7/2008 | Ye et al. | |
| 2010/0034235 A1 | 2/2010 | Chen | |
| 2010/0246633 A1 | 9/2010 | Chen et al. | |
| 2012/0119767 A1* | 5/2012 | Su ...................... | G01R 31/2875 324/750.03 |
| 2012/0327969 A1 | 12/2012 | Chan et al. | |
| 2014/0107965 A1 | 4/2014 | Mishra et al. | |

* cited by examiner

*Primary Examiner* — Tung X Nguyen
(74) *Attorney, Agent, or Firm* — Van Pelt, Yi & James LLP

(57) ABSTRACT

A mechanism for performing thermal testing is described. The system for performing thermal testing may include a housing, a heating element and a processor. The housing is configured to be compatible with a plurality of different types of transceiver form factors. The heating element is configured to be at a location within the housing to approximate an integrated circuit chip heat source of the plurality of different types of transceiver form factors. The processor is configured to automatically conduct a thermal test and provide thermal test results.

19 Claims, 4 Drawing Sheets

QUAD SMALL FORM-FACTOR PLUGGABLE THERMAL TEST VEHICLE

BACKGROUND OF THE INVENTION

As part of design and testing of computer systems, power dissipation is desired to be accounted for. For example, when developing a computing device such as a server, the server is desired to be tested to be certain that the central processing unit (CPU), graphics processing unit (GPU) and/or analogous components can be adequately cooled during usage. Similarly, when developing chassis to hold computing equipment in a data center, the chassis is designed to ensure that all of the computing equipment retained therein can be sufficiently cooled. Without such testing, the server, chassis or other computing apparatus may be unable to provide sufficient cooling for the corresponding components to stay within their temperature specifications. This may adversely affect performance of the deployed computing apparatus, for example reducing processor or communication speed, and may result in failure of the components. Accordingly, a mechanism for thermally testing computing apparatus is desired.

BRIEF DESCRIPTION OF THE DRAWINGS

Various embodiments of the invention are disclosed in the following detailed description and the accompanying drawings.

DETAILED DESCRIPTION

Figure 1A:
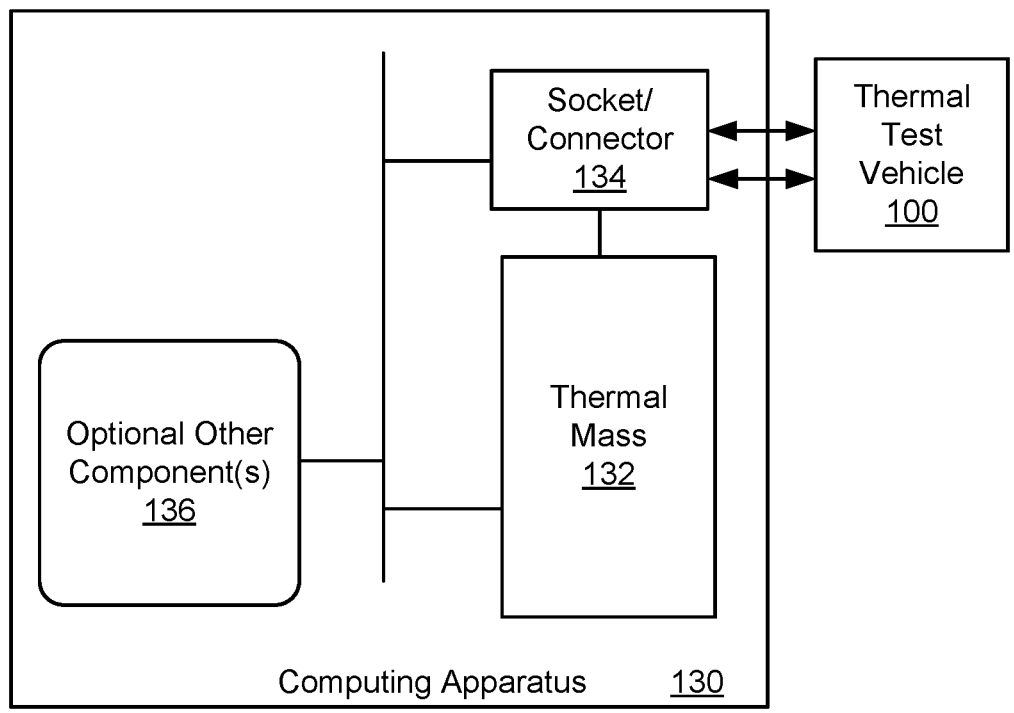
FIGS. 1A-1B are diagrams depicting an embodiment of a computing apparatus under test and a thermal test vehicle used in the test.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Thermal management of computing equipment is an integral part of the development process. Managing heat dissipation may be the limiting factor in not only the speeds attainable, but also reliability of components. For example, a computing apparatus such as a server is desired to be tested to ensure that the central processing unit (CPU), graphics processing unit (GPU), application specific integrated circuit (ASIC) and/or analogous components can be adequately cooled during usage. If the CPU and GPU are not sufficiently cooled, processing speed may be throttled and, in extreme cases, the processors damaged. Similarly, in planning a data center, components (e.g. CPUs and/or GPUs) for multiple servers within a chassis are desired to have sufficient cooling to function as desired. Other computing apparatus are desired to be capable of handling the heat generated by components used therein. For example, switches are desired to be capable of adequately dissipating the heat generated by transceivers therein in order to maintain the desired speed of communications. If thermal management is not incorporated into the development, the processor, the server, chassis, switch, networking device and/or other computing apparatus may be unable to adequately dissipate the heat from their components or other computing devices. This may result in poor performance or failures of the equipment that is deployed.

In order to thermally test power dissipation of components in a computing apparatus such as a server, switch or chassis, the components themselves may be used to provide the desired thermal profile for testing. For example, to determine whether a server can adequately cool a CPU or GPU, the server may be tested by running the CPU with a desired load. Similarly, a switch used in a data center may be tested utilizing quad small form-factor pluggable (QSFP) transceivers plugged into the appropriate sockets of the switch and various loads provided.

Although such methods allow for thermal testing of computing apparatus, there may be drawbacks. For example, the QSFP transceiver, CPU, GPU or other component may fail during the test. Such components may be expensive, increasing development costs. In addition, for the components to be tested, the computing apparatus must be capable of running the components. Thus, both hardware and software used are present in the computing apparatus. Consequently, testing may take place after the computing apparatus is nearing the end of the development phase. This makes any changes to the design of the computing apparatus based on the results of thermal testing more challenging to implement. Further, such methods may not easily allow for testing next generation components with current generation computing apparatus. Accordingly, a mechanism for improving thermal testing of computing apparatuses is desired.

A mechanism for thermal testing is described. A system for thermal testing (also termed a thermal test vehicle) includes a heating element, a thermal sensor and a processor. The processor is configured to control the heating element to output an amount of the energy. The processor also receives temperature readings from the thermal sensor and determines a thermal property associated with a thermal mass based at least in part the amount of the energy output by the heating element and the temperature readings received. The thermal mass is part of a computing apparatus under test and may be utilized in managing temperature of the computing apparatus and attached devices. Thus, the system may be used to test a computing apparatus based on the thermal mass of the computing apparatus. The computing apparatus can but need not have its functional components, such as processors and software, provided during testing.

The processor may control the heating element to provide the amount of energy in a particular manner. For example, the power output by the heating element may be varied and/or otherwise controlled to provide a particular amount of energy over a particular time interval. In some embodiments, the heating element may be controlled based upon the temperature readings. For example, the heating element may be turned off if the temperature readings indicate the temperature meets and/or exceeds a threshold temperature. Thus, the heating element may be prevented from failing during the test. In some embodiments, the power provided by the heating element is reduced or otherwise limited based on increases in temperature. In some embodiments, the processor is further configured to provide a test processing load. For example, the processor may mimic expected traffic to the computing apparatus, which the computing apparatus may process if components are present in the computing apparatus. Thus, the thermal load from the system (the amount of energy provided by the heating element) and an additional thermal load for the computing apparatus can be simulated.

Various thermal properties may be determined using the system and method described herein. In some embodiments, the mass multiplied by the thermal capacity of the thermal mass is determined based on the energy and change in temperature. In some embodiments, a steady-state temperature of the thermal mass is determined based on the energy and/or power (energy per unit time). In some embodiments, the steady-state temperature may be determined by fitting the temperature readings to a curve. Thus, the steady-state temperature of the thermal mass may be calculated before an actual steady-state temperature is reached by the thermal mass. Consequently, the method and system described herein may reduce the time required for testing the computing apparatus.

In some embodiments, the system may include a housing configured to be compatible with a plurality of different types of form factors. Thus, the system may be able to fit and communicatively with the computing apparatus. In some embodiments, the housing may be considered to include a circuit board on which the processor and heating elements reside. The housing also includes connectors for at least one of the form factors. For example, the housing may be compatible with various connectors used for CPUs, GPUs, transceivers and/or other computing devices.

In some embodiments, the heating element resides at a location in the housing corresponding to a power-consuming circuit element in a component for test. For example, the heating element may reside at or near the position of a CPU, GPU or ASIC on a circuit board. Further, in some embodiments, a heat spreader is thermally coupled to the heating element. Consequently, the desired thermal footprint may be provided by the system.

In some embodiments, the system (i.e. the thermal test vehicle) is plugged into a computing apparatus having a thermal mass. The heating element is controlled to output an amount of the energy. The thermal sensor provides temperature readings and a thermal property associated with the thermal mass determined based at least in part the amount of the energy and the temperature readings. In some embodiments, the processor controls the heating element, receives the temperature readings and determines the thermal property. In some embodiments, some or all of these functions may be provided by another device, such as a host computer system coupled to the test vehicle. As discussed above, this thermal testing of the computing apparatus may include varying the energy and/or energy per unit time output by the heating element, providing a test processing load to the computing apparatus and/or determining the steady-state temperature of the thermal mass. Thus, a computing apparatus may undergo thermal testing.

For example, the system for performing thermal testing may include a housing, a heating element and a processor. The housing is configured to be compatible with a plurality of different types of transceiver form factors. For example, the housing may be configured in a quad small form-factor pluggable (QSFP) configuration. The heating element is configured to be at a location within the housing to approximate an integrated circuit chip heat source of the plurality of different types of transceiver form factors. The processor is configured to automatically conduct a thermal test and provide thermal test results. Thus, the processor may control the heating element to provide a heat profile of the integrated circuit chip heat source. In some embodiments, the processor may further configured be to provide a test traffic load. The system may also include a light box for indicating status of the system, a pull handle coupled with the housing and/or a heat spreader coupled with the heating element.

Figure 1B:
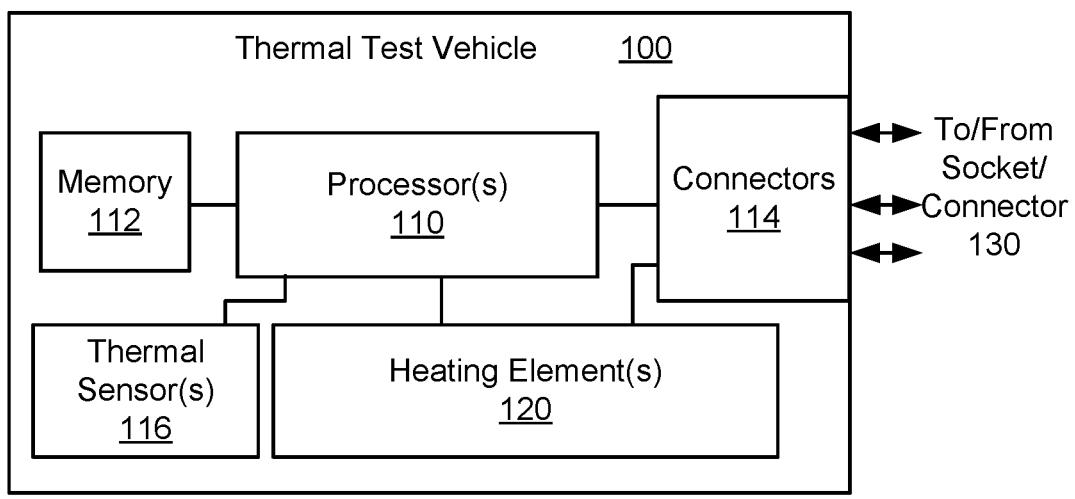

FIGS. 1A-1B are diagrams depicting an embodiment of a thermal test vehicle 100 and a computing apparatus 130 under test. Although certain components are shown, in some embodiments, other and/or additional components may be present. Computing apparatus 130 includes thermal mass 132 and connector or socket 134. Thermal mass 132 may include a heat sink, the frame of computing apparatus 130 and/or other mechanism used in managing heat in computing apparatus 130. Socket/connector 134 is used to allow for connection to components. Socket/connector may be a portion of a board to which a component such as a processor and/or other board may be attached or may be an external connector for additional devices. In some embodiments, other components 136 may be included in computing apparatus 130. For example, processor(s), memory, sensor(s) and/or other components that are desired to be part of computing apparatus 130 may be included. However, in some embodiments, some or all of such components may be omitted. Thus, computing apparatus 130 may be very early in the design and prototyping process.

Thermal test vehicle 100 is an embodiment of a system for performing thermal testing of computing apparatus 130. Thermal test vehicle 100 includes one or more processors 110, connectors 114, one or more thermal sensors 116 and one or more heating elements 120. For simplicity, thermal test vehicle 100 is described in the context of a single processor 110, a single thermal sensor 116 and a single heating element 120. Also shown is memory 112 that may store instructions for processor 110. In some embodiments, additional components may be included. For example, in addition to thermal sensor 116, thermal test vehicle 100 may include current sensors, voltage sensors and/or other sensors. In some embodiments, thermal test vehicle 100 may include a connector for the coupling to a host (not shown).

Heating element 120 is a ceramic heater in some embodiments. Thus, heating element 120 may effectively be a resistor that can output a desired amount of power. In some embodiments, heating element 120 is capable of outputting an amount of heat per unit time that simulates the actual component designed to be connected to socket/connector 134. For example, heating element 120 may be used to the mimic the heat profile of a CPU, GPU, transceiver, and/or other component. The combination of one or more heating element 120 may output an amount of energy that may vary widely. For example, if a particular heating element 120 may provide zero through five hundred watts, a combination of five heating elements 120 might output fifty Watts through two thousand five hundred Watts. In other embodiments, other powers may be possible utilizing various configurations of heating elements 120. In some embodiments, processor 110 controls heating element 120. Thus, the power provided by heating element 120 may change over time. For example, processor 110 may control heating element 120 to increase or decrease the power output over time. In some embodiments, limits maybe placed on the power output or time over which the power is output. In addition, heating element 120 may be turned off or driven at a lower thermal output by processor 110, for example if a measure of the temperature of computing apparatus 130 reaches or exceeds a threshold temperature.

Thermal sensor 116 measures temperature and provides the temperature readings to processor 110. Because thermal test vehicle 100 is plugged into socket/connector 134 and because of the presence of thermal mass 132, the output of thermal sensors 116 not only indicates the temperature of thermal test vehicle 100, but also the temperature of computing apparatus 130.

Processor 110 may also determine thermal properties associated with thermal mass 132 based on temperature readings received from thermal sensors 116. For example, processor 110 may control heating element 120 to output a particular amount of energy. In some embodiments, this amount of energy may be output over a particular amount of time or may correspond to a known variation in power over time. Processor 110 may calculate the thermal capacity multiplied by the mass by calculating the integral of the power over time and dividing by the temperature difference. For a known mass of thermal mass 132, processor 110 can determine the thermal capacity. Processor 110 may determine the steady-state temperature of thermal mass 132 based on the power being output by heating elements 20 and temperature readings from thermal sensor 116. For example, processor 110 may curve fit the readings received by thermal sensor 116 to a known curve. Other thermal properties of computing apparatus 130 may be determined by processor 110 in some embodiments. Thus, processor 110 may determine one or more thermal properties of computing apparatus 130.

Using thermal test vehicle 100, thermal properties of computing and networking apparatus 130 may be determined. Computing apparatus may include devices such as servers, switches, chassis, networking devices and/or analogous device. Heating element 120 simulates the power dissipated by a CPU, GPU or other component to be connected to computing apparatus 130. Consequently, the actual CPU, GPU or other component need not be used. Therefore, thermal testing using thermal test vehicle 100 may be more cost effective and less wasteful. Because the actual CPU, GPU or other component are not required for thermal testing, software and other devices used to drive such components need not be included in computing apparatus 130. Thus, testing using thermal test vehicle may occur earlier in the development process. Consequently, desired changes to computing apparatus 130 may be more easily incorporated. For example, additional thermal mass may be added, active cooling (e.g. more fans) might be integrated and/or components having reduced power generation may be selected for use. Because processor 110 can determine thermal properties such as steady state temperature and/or thermal capacity, testing may be made more time efficient and simpler. Thermal test vehicle 100 may also simulate power generated by future generation components. For example, CPUs having higher speeds and requiring more power dissipation than are currently available may be mimicked using heating element 120. The ability of computing apparatus 130 to dissipate heat for future generation components may thus be determined. Thermal test vehicle 100 may also be modular. For example, in order to test computing apparatus 130 for a different component, additional heating element(s) may be added to thermal test vehicle 100 or heating element may be driven in a different manner. Consequently, thermal test vehicle 100 improves testing and development of computing apparatus 130.

Figure 2A:
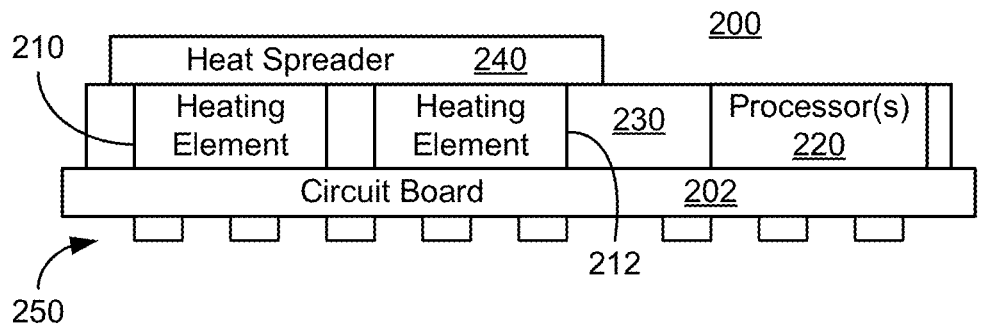
FIGS. 2A-2B are diagrams depicting an embodiment of a thermal test vehicle.
Figure 2B:
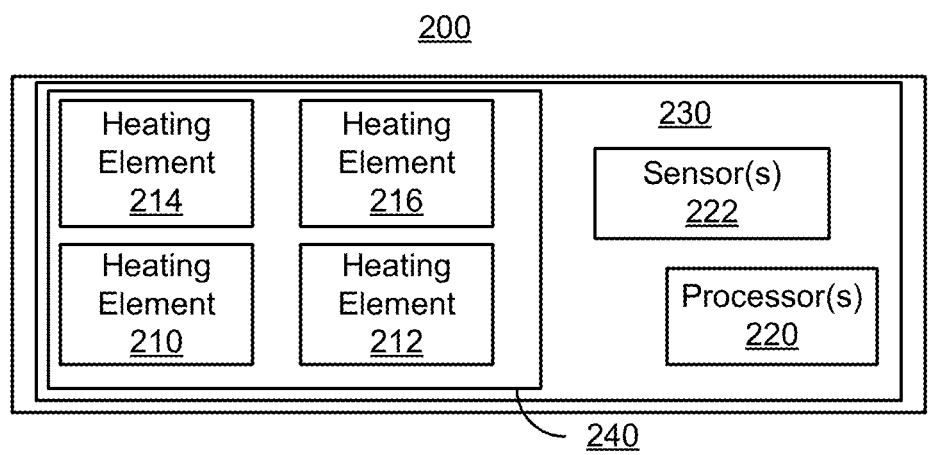

FIGS. 2A-2B are side and plan views, respectively, of an embodiment of thermal test vehicle 200. FIGS. 2A and 2B are not to scale. Thermal test vehicle 200 is analogous to thermal test vehicle 100. Thermal test vehicle 200 may be used in connection with testing power management capabilities of a computing apparatus such as computing apparatus 130. Although certain components are shown, in some embodiments, other and/or additional components may be present.

Thermal test vehicle 200 includes circuit board 202, heating elements 210, 212, 214 and 216, processor(s) 220, insulator 230, heat spreader 240 and connectors 250. Circuit board 202 and connectors 250 may be considered part of a housing that is configured to fit the form factor of the connector/socket for the corresponding computing apparatus. For example, connectors 250 may be used to mount thermal test vehicle 200 to the baseboard of a computing apparatus, such as computing apparatus 130 to be tested. However, the computing apparatus being tested need not include software or all components typically present on the baseboard in order to use thermal test vehicle 200 in investigating the computing apparatus' thermal properties. In some embodiments, insulator 230, which surrounds at least a portion of the constituents of thermal test vehicle 200, may also be considered part of the housing.

Heating elements 210, 212, 214 and 216 are selected to provide sufficient power to simulate the component(s) which are to be connected to the computing apparatus and for which heat is desired to be dissipated. In some embodiments, the location of heating elements 210, 212, 214 and 216 on circuit board 202 corresponds to the location of the component(s) to be connected to the computing apparatus. For example, heating elements 210, 212, 214 and 216 may be at the location on circuit board 202 of the CPU(s), GPU(s) and/or ASIC(s) desired to be connected to the computing apparatus.

Heat spreader 240 is included in the embodiment shown. Although one heat spreader 240 is shown, in other embodiments multiple heat spreaders may be included. For example, heat spreader 240 may be a copper plate, which may be anodized. In some embodiments, heat spreader is attached to circuit board 202 via screws (not shown). However, other attachment mechanisms may be utilized. Heat spreader 240 may be used to more evenly distribute heat generated by heating elements 210, 212, 214 and 216. Thus, individual heading elements 210, 212, 214 and 216 may have a heat profile of a single component at the location of and having substantially the same size as heat spreader 240. Thus, the location and power provided by heating elements 210, 212, 214 and 216 and heat spreader 240 simulate the power-consuming circuit element desired to be coupled with the computing apparatus being tested.

Insulator 230 thermally and electrically insulates heating elements 210, 212, 214 and 216. Insulator 230 may be subjected to variable heat output from heating elements 210, 212, 214 and 216. For example, during testing, the heat output may vary from 0 W to 2.5 kW or more. Insulator 230 is desired to undergo thermal cycling due to such high powers substantially without deforming or cracking. For example, insulator 230 may be garolite or an analogous material. Insulator 230 may also reduce or prevent the tendency of heat generated by heating elements 210, 212, 214 and 216 to travel toward circuit board 202. Consequently, heat generated by heating elements 210, 212, 214 and 216 may be more likely to move toward heat spreader 240. Thus, circuit board 202 may be less likely to be damaged and heat may be more efficiently driven toward heat spreader 240. Heat spreader 240 may be thermally coupled with the thermal mass (not shown in FIGS. 2A-2B) for the computing apparatus (not shown in FIGS. 2A-2B). Thus, heat generated by heating elements 210, 212, 214 and 216 may be managed using the thermal mass of the computing apparatus being tested.

Sensor(s) 222 include thermal sensors that read the temperature of heating elements 210, 212, 214 and 216 and/or the temperature of the thermal mass to which heating elements 210, 212, 214 and 216 are thermally coupled. Sensor(s) 222 may also include current and/or voltage sensors that measure the signals driving heating element(s) 210, 212, 214 and/or 216. In some embodiments, other sensors may be included. Thus, various characteristics of thermal test vehicle 200 and the computing apparatus to which thermal test vehicle 200 is connected may be measured.

Processor(s) 220 control the heat generated by heating elements 210, 212, 214 and 216. Thus, processor(s) 220 may control the current through and/or voltage across heating elements 210, 212, 214 and 216. For example, processor 220 may drive heating elements 210, 212, 214 and 216 such that they generate the same or different powers, for the same or different times, to vary in the same or different manners, to ramp up to maximum power at the same or different rates, or otherwise be managed to provide the desired temperature profile. Thus, heating elements 210, 212, 214 and 216 may simulate the power generated by component(s) desired to be connected to a computing apparatus. In some embodiments, processor(s) 220 control the total amount of energy (e.g. heat) generated by heating elements 210, 212, 214 and 216. In some embodiments, processor(s) 220 control the power (energy per unit time) generated by heating elements 210, 212, 214 and 216. In some embodiments, processor(s) 220 control both the power and the amount of energy generated by heating elements 210, 212, 214 and 216.

Processor(s) 220 receive readings from sensor(s) 222. In some embodiments, processor(s) 220 control heating elements 210, 212, 214 and/or 216 based upon the readings. For example, processor(s) 220 may reduce or terminate the current driving and/or voltage across one or more of heating elements 210, 212, 214 and 216 if thermal sensors indicate that the temperature has met or exceeded a threshold. Similarly, processor(s) 220 may increase or initiate the current and/or voltage driving one or more of heating elements 210, 212, 214 and 216 if thermal sensors indicate that the temperature has met or dropped below another threshold. Further, processor(s) 220 may also control heating elements 210, 212, 214 and/or 216 to simulate particular components.

Utilizing the readings provided by sensor(s) 222, processor(s) 220 may also determine thermal properties of a thermal mass that is part of a computing system. For example, the mass multiplied by the thermal capacity, the thermal capacity and/or the steady-state temperature may be determined by processor(s) 220 based upon the readings from sensor(s) 222 received by processor(s) 220.

Thus, thermal test vehicle 200 may be used to thermally test computing apparatus. Thermal test vehicle 200 shares the benefits of thermal test vehicle 100. Thus, the thermal properties of the computing apparatus being investigated may be determined more cost effectively, earlier in the development process, in a more time efficient manner, and/or without wasting of components. Further, the ability of the computing apparatus to be utilized with next generation components may be determined. Thus, thermal testing of a computing apparatus may be improved.

Figure 3:
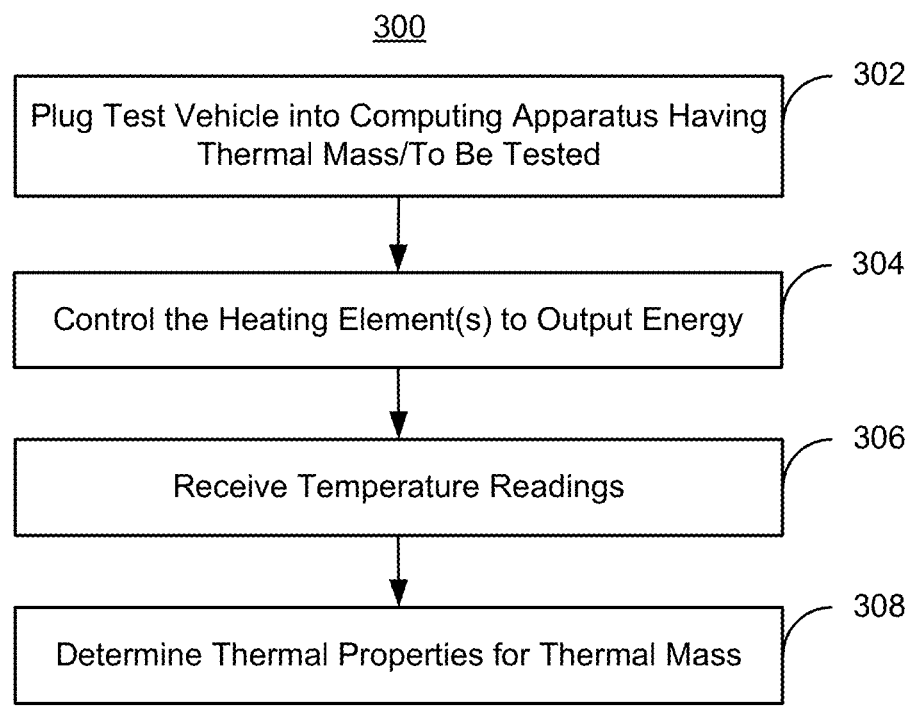
FIG. 3 is a flow chart depicting an embodiment of a method for thermally testing a computing apparatus.

FIG. 3 is a flow chart depicting an embodiment of method 300 for thermally testing a computing apparatus. Method 300 is described in the context of thermal test vehicle 100 and computing apparatus 130. However, method 300 may be utilized with other thermal test vehicles and/or other computing apparatus. The processes of method 300 may include substeps. The processes of method 300 are also shown in a particular order, but may be performed in another order including in parallel.

The thermal test vehicle is plugged into a computing apparatus having a thermal mass and for which thermal management is desired to be tested, at 302. Thus, the connectors and/or housing of the thermal test vehicle are attached to the appropriate portion of the computer apparatus. The thermal test vehicle includes heating element(s), thermal sensor(s), processor(s) and, optionally, other components such as current and/or voltage sensors.

The heating element(s) are controlled to output an amount of energy, at 304. In some embodiments, the heating element(s) are controlled at 304 using the processor(s). Thus, at 304 the desired heat profile that simulates the component that is to be plugged into the connector of the computing apparatus is provided.

Temperature readings are received, at 306. In some embodiments, the temperature readings from the thermal sensor(s) are received at the processor(s). Thus, the temperature of the thermal test vehicle and, therefore, the thermal mass to which the thermal test vehicle is thermally connected, is tracked.

One or more thermal properties for the thermal mass are determined based upon the temperature readings received, at 308. In some embodiments, the thermal properties are also determined using the amount of energy provided by the heating element(s) and/or the amount of the energy per unit time. In some embodiments, the thermal properties are automatically determined at 308.

For example, thermal test vehicle 100 may be plugged into connectors 134, at 302. Processor 110 can control heating element 120 to output energy, at 304. At least while the element 120 is energized, thermal sensor 116 collects temperature data. In some embodiments, thermal sensor 116 collects temperature data before heating element 120 is energized and/or after heating element 120 has been shut down. Thermal sensor 116 provides these temperature readings to processor 110. In some embodiments, the temperature readings are provided to processor 110 substantially in real time. In other embodiments, temperature readings may be stored and received at processor 110 at a later time. Using these temperature readings, processor 110 may automatically calculate one or more thermal properties of the thermal mass. In some embodiments, another processor, for example on a host system (not shown) determines the thermal properties and/or controls heating elements 110. Using method 300, the thermal properties of the thermal mass may be determined. Thus, the benefits of thermal test vehicle 100 may be realized.

Figure 4:
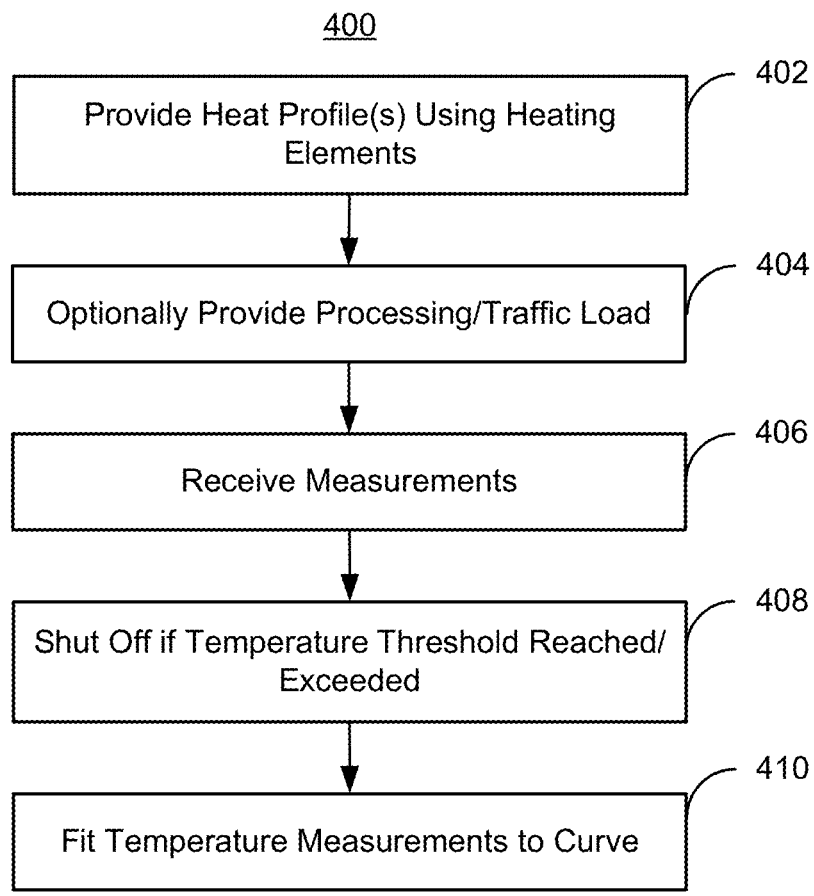
FIG. 4 is a flow chart depicting an embodiment of a method for thermally testing a computing apparatus.

FIG. 4 is a flow chart depicting an embodiment of method 400 for thermally testing a computing apparatus. Method 400 is described in the context of thermal test vehicle 100 and computing apparatus 130. However, method 400 may be utilized with other thermal test vehicles and/or other computing apparatus. The processes of method 400 may include substeps. The processes of method 400 are also shown in a particular order, but may be performed in another order including in parallel. Method 400 also commences after the thermal test vehicle is plugged into a computing apparatus having a thermal mass and for which thermal management is desired to be tested.

The heating element(s) are controlled to output the desired heat profiles, at 402. In some embodiments, the heating element(s) are controlled at 402 using the processor(s). The desired heat profiles simulate the component that is to be plugged into the connector of the computing apparatus. The processing load or traffic is optionally provided, at 404. For example, the processor may send particular signals or instructions to a processor that has been incorporated into the computing apparatus being tested.

Sensor readings are taken at least while the heating element(s) are energized. In some embodiments, the sensor readings are also collected before the heating element(s) are energized and/or after heating element(s) have been shut down. The sensor readings include temperature readings collected by thermal sensor(s). In some embodiments, other sensor readings may also be taken. For example, current and/or voltage to each of the heating element(s) may be read.

Sensor readings are received, at 404. In some embodiments, the sensor readings s) are received at the processor(s). The received sensor readings include at least temperature data. In some embodiments, current, voltage and/or other characteristics measured may also be received at 404. Thus, the temperature of the thermal test vehicle and, therefore, the thermal mass to which the thermal test vehicle is thermally connected, is tracked.

Figure 5:
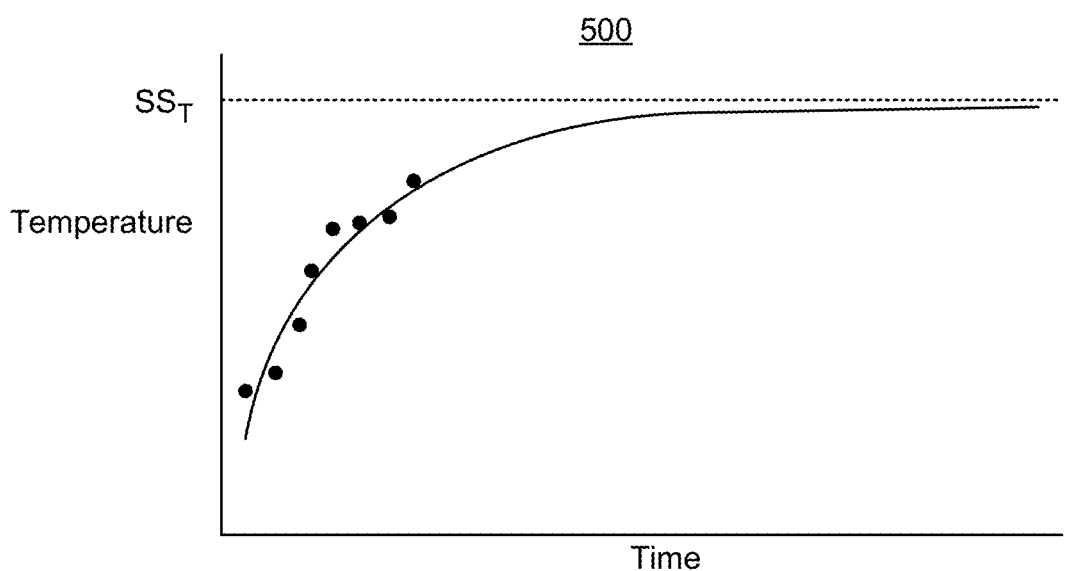
FIG. 5 is a graph depicting an embodiment of a thermal property determined using a thermal test vehicle.

The heating element(s) are optionally shut off if the temperature readings indicate that a threshold has been reached or exceeded, at 408. Thus, the heating element(s) may be prevented from being burned out. The temperature readings are fit to curve(s) to determine one or more thermal properties of the thermal mass, at 410. For example, the steady-state temperature of the thermal mass may be determined. FIG. 5 depicts an embodiment of graph 500 indicating temperature versus time for the temperature readings. Temperature readings are indicated by black circles. These data have been fit to a curve, shown by the solid line. Although a certain number of temperature readings are shown, in other embodiments, another number of readings may be used. In some embodiments, only enough data to reliably (e.g. to within at least five percent or ten percent) fit the temperature readings to the curve is collected. As can be seen in FIG. 5, the curve approaches the steady-state temperature, $SS_T$, for the heat profiles provided using the heaters. However, as can be seen in graph 500, temperature data need not be collected throughout the times shown. Instead, via curve fitting, the steady state temperature can be determined for a fewer number of points and a shorter time interval. Thus, method 400 need not be continued until the thermal mass actually reaches (or closely approaches) the steady-state temperature.

For example, thermal test vehicle 100 may be plugged into connectors 134. Processor 110 used to control heating element 120 to output sufficient energy to provide the desired heat profile(s), at 402. At least while the element 120 is energized, thermal sensor 116 collects temperature data. In some embodiments, the temperature readings are provided to processor 110 substantially in real time. In other embodiments, temperature readings may be stored and received at processor 110 at a later time. Processor 110 fits the received temperature readings to a curve, at 410. In some embodiments, another processor, for example on a host system (not shown) performs the curve fitting and/or controls heating elements 110. Using method 400, the thermal properties of the thermal mass may be determined. Thus, the benefits of thermal test vehicle 100 may be realized.

Figure 6A:
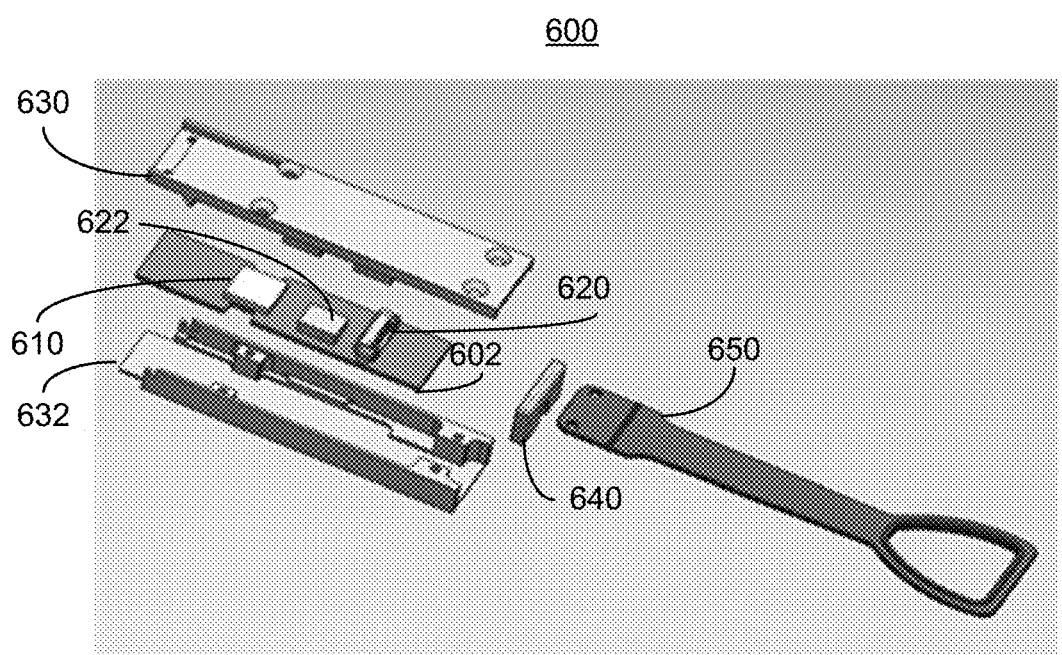
FIGS. 6A-6B are diagrams depicting an embodiment of a thermal test vehicle.
Figure 6B:
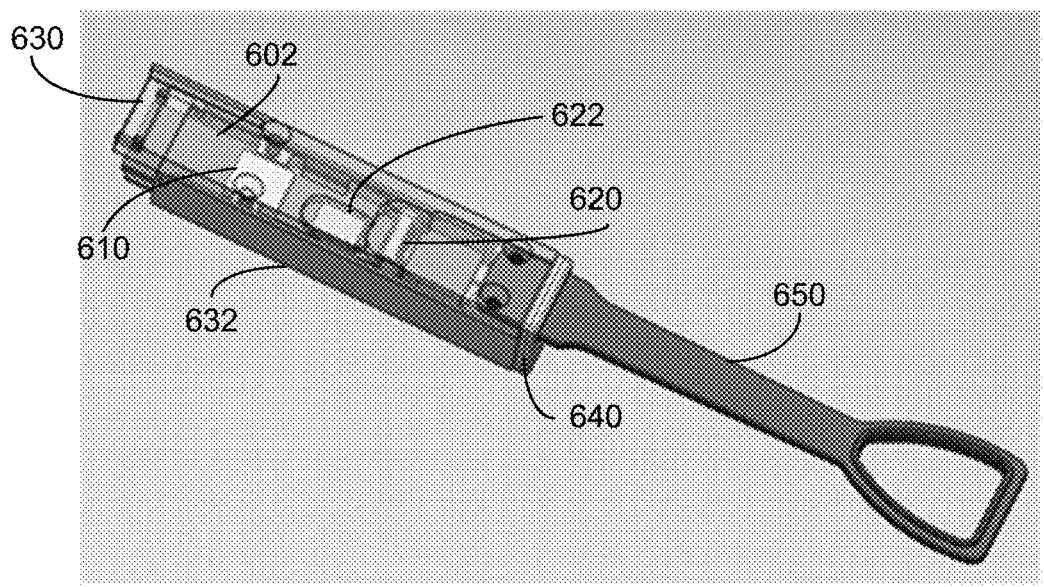

FIGS. 6A-6B are exploded and assembled views, respectively, of an embodiment of thermal test vehicle 600. FIGS. 6A and 6B are not to scale. Thermal test vehicle 600 is analogous to thermal test vehicles 100 and/or 200. Thermal test vehicle 600 may be used in connection with testing power management capabilities of a computing apparatus such as computing apparatus 130. More specifically, thermal test vehicle 600 may be utilized in testing computing apparatus, such as switches, that incorporate transceivers. Thus, thermal test vehicle 600 may be a quad small form-factor pluggable (QSFP) thermal test vehicle and is described in the context of developing a switch. Although certain components are shown, in some embodiments, other and/or additional components may be present.

QSFP thermal test vehicle 600 includes circuit board 602, heating element(s) 610, processor(s) 620, and sensor(s) 622. Also shown are top housing 630 and bottom housing 632 (collectively housing 630/632). For ease of explanation, top housing 630 is shown as transparent in FIG. 6B. Circuit board 602 may be considered part of the housing 630/632 in that circuit board 602 retains and allows electrical connection to heating element(s) 610, processor(s) 620 and sensor(s) 630. QSFP thermal test vehicle 600 may be plugged into a socket of a switch (not shown in FIGS. 6A-6B). In some embodiments, housing 630/632 is configured to fit multiple QSFP form factors. In some cases, multiple QSFPs may be plugged into a particular switch. Thus, in some cases multiple QSFP thermal test vehicles may be plugged into the switch under test. However, the switch being tested need not include software or all components typically present in a switch in order to use QSFP thermal test vehicle 600 in investigating the switch's thermal properties.

QSFP thermal test vehicle 600 also includes pull handle 650 and light box 640 in the embodiment shown. Light box 640 indicates the status of the QSFP thermal test vehicle 600. For example, lights in light box 640 may be lit when QSFP thermal test vehicle is properly connected and/or being used. For example, light box 640 may be energized when heating elements 610 are driven. Pull handle 650 aids in inserting QSFP thermal test vehicle 600 into or removing QSFP thermal test vehicle from the socket of a switch being tested. In other embodiments, light box 640 and/or pull handle 650 may be configured differently or omitted.

Heating element(s) 610 are selected to provide sufficient power to simulate the integrated circuits that are part of a corresponding QSFP module desired to be connected to the switch and for which heat is desired to be dissipated. In some embodiments, the location of heating element(s) 610 on circuit board 602 and within housing 630/632 corresponds to the location of the integrated circuit(s) to be connected to the switch. Heating element(s) 610 may be driven simulate the power generated for current traffic carried by QSFP modules currently in use, such as 40-50G. Because heating element(s) 610 may be controlled, the power generated for other traffic speeds may be simulated. For example, in some embodiments, 100G, 150C, 200G and up to 400G may be simulated using QSFP thermal test vehicle 600.

QSFP thermal test vehicle 600 may also include a heat spreader thermally coupled to the heating element(s) 610. The heat spreader is utilized to provide a thermal footprint consistent with integrated circuits used in QSFP modules. Thus, the location and power provided by heating element(s) 610 and any corresponding heat spreader simulate the integrated circuit element desired to be coupled with the switch being tested. In some embodiments, an insulator analogous insulator 230 surrounds at least a portion of the constituents of QSFP thermal test vehicle 600, such as heating elements 610. Further, the insulator described above may be configured to undergo thermal cycling to high powers consistent with QSFP modules substantially without deforming or cracking. For example, the insulator may be garolite or an analogous material. Such an insulator may also aid in directing heat generated by heating elements 610 to travel away from circuit board 602 and toward the heat spreader (if any). Thus, circuit board 602 may be less likely to be damaged. Heating element(s) 610 and any heat spreader may be thermally coupled with the thermal mass (not shown in FIGS. 6A-6B) for the switch (not shown in FIGS. 6A-6B). Thus, heat generated by heating element(s) 610 may be managed using the thermal mass of the switch being tested.

Sensor(s) 622 include thermal sensors that read the temperature of heating element(s) 610 and/or the temperature of the thermal mass of the switch being tested. Sensor(s) 622 may also include current and/or voltage sensors that measure the signals driving heating element(s) 610. In some embodiments, other sensors may be included. Thus, various characteristics of QSFP thermal test vehicle 600 and the switch to which QSFP thermal test vehicle 600 is connected may be measured.

Processor(s) 620 may be used to automatically conduct a thermal test and provide thermal test results. Thus, processor(s) 620 drive heating element(s) 610, receive temperature readings and/or other data from sensor(s) 622, and determine the thermal properties of the switch being tested. For example, processor(s) 620 may determine the thermal capacity and/or steady state temperature of the switch for control the heat generated by heating element(s) 610. Thus, processor(s) 620 may control the current through and/or voltage across heating elements 610. For example, processor 620 may drive multiple heating element(s) 610 such that they generate the same or different powers, for the same or different times, to vary in the same or different manners, to ramp up to maximum power at the same or different rates, or otherwise be managed to provide the desired temperature profile. Thus, heating element(s) 610 may simulate the power generated by component(s) desired to be connected to a switch. In some embodiments, processor(s) 620 control the total amount of energy (e.g. heat) generated by heating elements 610. In some embodiments, processor(s) 620 control the power (energy per unit time) generated by heating element(s) 610. In some embodiments, processor(s) 620 control both the power and the amount of energy generated by heating element(s) 610.

Processor(s) 620 receive readings from sensor(s) 622. In some embodiments, processor(s) 620 control heating elements 610 based upon the readings. For example, processor(s) 620 may reduce or terminate the current driving and/or voltage across one or more of heating elements 610 if thermal sensors indicate that the temperature has met or exceeded a threshold. Similarly, processor(s) 620 may increase or initiate the current and/or voltage driving one or more of heating element(s) 610 if thermal sensors indicate that the temperature has met or dropped below another threshold. Further, processor(s) 620 may also control heating element(s) 610 to simulate particular components.

Utilizing the readings provided by sensor(s) 622, processor(s) 620 may also determine thermal properties of a thermal mass that is part of the switch. For example, the mass multiplied by the thermal capacity, the thermal capacity and/or the steady-state temperature may be determined by processor(s) 620 based upon the readings from sensor(s) 622 received by processor(s) 620.

Thus, thermal test vehicle 600 may be used to thermally test a switch. Thermal test vehicle 600 shares the benefits of thermal test vehicle(s) 100 and/or 200. Thus, the thermal properties of the switch being investigated may be determined more cost effectively, earlier in the development process, in a more time efficient manner, and/or without wasting of components. Further, the ability of the switch to be utilized with future generation components may be determined. Thus, thermal testing of a switch may be improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a housing configured to be compatible with a plurality of different types of transceivers;
a heating element configured to be at a location within the housing to approximate an integrated circuit chip heat source of the plurality of different types of transceivers;
a thermal sensor; and
a processor configured to automatically conduct a thermal test including by being configured to receive temperature readings from the thermal sensor and provide thermal test results, wherein the thermal test results include a temperature of a thermal mass in an apparatus coupled to the system.

2. The system of claim 1, wherein the processor is further configured to provide a test traffic load.

3. The system of claim 1, wherein the thermal test results further include a steady-state temperature of the thermal mass based on the temperature readings.

4. The system of claim 3, wherein the processor being configured to provide thermal test results includes the processor being configured to:
curve fit the temperature readings to calculate the steady-state temperature of the thermal mass before an actual steady-state temperature is reached by the thermal mass.

5. The system of claim 1, wherein the housing is configured in a quad small form-factor pluggable configuration.

6. The system of claim 1, wherein the processor being configured to automatically conduct a thermal test further includes the processor being configured to control the heating element to provide a heat profile of the integrated circuit chip heat source.

7. The system of claim 1, wherein the processor being configured to automatically conduct a thermal test further includes the processor being configured to control the heating element to provide a plurality of amounts of energy per unit time.

8. The system of claim 1, further comprising:
a light box for indicating status of the system.

9. The system of claim 1, further comprising:
a pull handle coupled with the housing.

10. The system of claim 1, further comprising:
a heat spreader coupled with the heating element.

11. A system, comprising:
a housing configured to be compatible with a plurality of different types of transceiver form factors;
a heating element configured to be at a location within the housing to approximate an integrated circuit chip heat source of the plurality of different types of transceiver form factors;
a heat spreader coupled with the heating element;
a thermal sensor; and
a processor configured to automatically conduct a thermal test and provide thermal test results including a steady-state temperature of a thermal mass, the processor being configured to provide the thermal test results including the processor being configured to
receive temperature readings from the thermal sensor; and
curve fit the temperature readings to calculate the steady-state temperature of the thermal mass before an actual steady-state temperature is reached by the thermal mass.

12. A method, comprising:
plugging a test vehicle into an apparatus having a thermal mass, the test vehicle including a housing, a heating element and a thermal sensor, the housing configured to be compatible with a plurality of different types of transceivers, the heating element configured to be at a location within the housing to approximate an integrated circuit chip heat source of the plurality of different types of transceivers;
controlling the heating element to provide a heat profile corresponding to the integrated circuit chip heat source;
receiving temperature readings from the thermal sensor, and
providing thermal test results based on the temperature readings, the thermal test results including a temperature of the thermal mass in the apparatus coupled to the test vehicle.

13. The method of claim 12, wherein the test vehicle further includes a processor and wherein the controlling, receiving and providing steps are performed by the processor.

14. The method of claim 13, further comprising:
utilizing the processor to provide a test traffic load to the apparatus corresponding to the thermal mass.

15. The method of claim 13, wherein the providing the thermal test results further includes:
determining a steady-state temperature of the thermal mass based on the temperature readings received.

16. The method of claim 15, wherein the determining the steady-state temperature further includes:
curve fitting the temperature readings to calculate the steady-state temperature of the thermal mass before an actual steady-state temperature is reached by the thermal mass.

17. The method of claim 13, wherein the controlling the heating element further includes:
controlling the heating element to provide a plurality of amounts of energy per unit time.

18. The method of claim 13, further comprising:
controlling the heating element based on the temperature readings.

19. The method of claim 18, wherein the heating element is further configured to be shut off based on the temperatures readings reaching a threshold.

* * * * *